US006537867B1

(12) United States Patent
Freyman et al.

(10) Patent No.: US 6,537,867 B1
(45) Date of Patent: Mar. 25, 2003

(54) HIGH SPEED LOW VOLTAGE SEMICONDUCTOR DEVICES AND METHOD OF FABRICATION

(75) Inventors: Ronald L. Freyman, Bethlehem, PA (US); Isik C. Kizilyalli, Millburn, NJ (US); Ross A. Kohler, Allentown, PA (US); Omkaram Nalamasu, Bridgewater, NJ (US); Mark R. Pinto, Summit, NJ (US); Joseph R. Radosevich, Orlando, FL (US); Robert M. Vella, Bridgewater, NJ (US); George P. Watson, Avon, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/630,463

(22) Filed: Aug. 2, 2000

Related U.S. Application Data

(60) Provisional application No. 60/163,230, filed on Nov. 3, 1999.

(51) Int. Cl.$^7$ .............................................. H01L 21/336
(52) U.S. Cl. ....................................... 438/197; 438/275
(58) Field of Search ................................ 438/197, 275, 438/401; 430/5, 311, 312, 313

(56) References Cited

U.S. PATENT DOCUMENTS

| 5,766,806 | A | * | 6/1998 | Spence | 430/5 |
| 5,807,649 | A | * | 9/1998 | Liebmann et al. | 430/5 |
| 5,858,580 | A | | 1/1999 | Wang et al. | 430/5 |
| 6,057,063 | A | * | 5/2000 | Liebmann et al. | 430/5 |
| 6,228,539 | B1 | * | 5/2001 | Wang et al. | 430/5 |

* cited by examiner

Primary Examiner—Long Pham

(57) ABSTRACT

A digit signal processor capable of operating at 100 MHZ with a 1.0 volt power supply. The digital signal processor is fabricated by application of strong phase-shift lithography to obtain a 0.12 μm gate dimension. A dual-mask process is utilized to improve resolution thereby producing high speed, low-voltage processors. A n$^+$/p$^+$ dual-Poly:Si module, and dopant penetration suppression techniques may be utilized.

37 Claims, 3 Drawing Sheets

HIGH SPEED LOW VOLTAGE SEMICONDUCTOR DEVICES AND METHOD OF FABRICATION

This application claims the benefit under Title 35 U.S.C. §120 of U.S. Provisional Application No. 60/163230 filed on Nov. 3, 1999, the disclosure of which is specifically incorporated herein by reference.

FIELD OF THE INVENTION

The invention relates to phase-shift lithography, particularly useful for semiconductor device fabrication.

BACKGROUND OF THE INVENTION

Semiconductor device speed may be increased and device supply-voltage/power dissipation may be reduced by decreasing transistor threshold voltages, gate oxide thicknesses and/or transistor feature size. Such modifications have reduced the supply voltage of a 0.25 $\mu$m technology chip operating at approximately 100 MHz to only about 1.0 V.

Improvements to lithographic methods provide an avenue for transistor feature size reduction. For cost efficiency it is particularly desirable to reduce feature size using existing lithography tools. Currently, certain wavelength lithography tools are more widely used than others. Therefore, it is preferable to implement lithography techniques using the more common tools.

Alternating phase-shift masks used in photolithography methods have been implemented to enable reduction in feature size by decreasing diffraction effects and thus increasing resolution. The mask imparts a phase-shift to the incident radiation, typically by $\pi$ radians for a portion of the mask pattern. By providing adjacent mask pattern features with different phases from one another, diffracted regions may be canceled, thereby improving resolution.

Another approach to enabling feature size reduction, and consequently increasing device speed and reducing supply-voltage requirements and power dissipation, is the use of dual-mask processes. In a dual-mask process a phase-shift mask is used to image features that, because of their dimensions and/or positions, benefit from the mask's resolution enhancing capabilities. A second mask, typically a binary mask, is used to trim unwanted phase boundaries by double-exposing those areas.

To further increase device speed and reduce supply-voltage and power dissipation, low threshold voltage channel PMOS transistors have been fabricated using a WSi/WSiN/Poly:Si ($n^+/p^+$) gate electrode stack. The stack helps prevent boron lateral diffusion to enable fabrication of the low-threshold voltage transistors. Reduced feature size devices using this technology, have resulted in digital signal processors having improved speed and a reduced supply voltage.

It is desirable to increase device speed and decrease supply-voltage and power dissipation beyond what is described above to further improve device performance. It is also desirable to do so using existing manufacturing tools. It is particularly desirable to enhance the speed of digital signal processors which are currently the computing engines of choice for low-cost, low-power applications such as telecommunications.

SUMMARY OF THE INVENTION

A multi-mask, strong phase-shift lithographic process is used to fabricate a digital signal processor capable of operating at 100 MHz with a 1.0 volt power supply.

In an illustrative embodiment of the invention a first exposure is made through a dark field phase-shift mask to define a first portion of the gate electrode, and a second exposure is performed through a binary bright field mask to shadow the first portion of the gate electrode and define a second portion of the gate electrode. This two-mask exposure process simplifies phase shifting and assists in scaling down gate lengths.

In a further embodiment of the invention a $n^+/p^+$ dual-Poly:Si module, and dopant penetration suppression techniques are utilized to attain the desired operating frequency and power.

Further disclosed is a digital signal processor comprising one or more components fabricated according to the method.

DESCRIPTION OF THE DRAWINGS

FIGS. 1A–1E depict fabrication of a semiconductor device according to embodiments of the invention.

DETAILED DESCRIPTION OF THE INVENTION

Figure 1A:
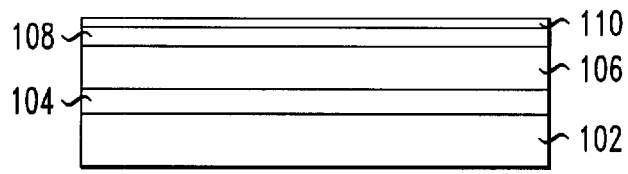

A digital signal processor capable of operating at 100 MHZ with a 1.0 volt power supply is fabricated by application of a multi-mask, strong phase-shift lithographic process. The process achieves gate dimensions of less than about 0.12 $\mu$m. Advantageously, the process may be performed with currently available fabrication equipment.

A dual-mask process is used in one embodiment of the invention to define gates having sub-wavelength dimensions, wherein the wavelength is that of radiation used to pattern device features. The first mask is used to image the lines of interest with phase-shifting, while the second mask, trims unwanted phase boundaries by double exposure. An exemplary trim mask is a non-phase-shift mask such as a binary mask. The line-imaging mask shall be referred to herein as the "phase-shift" mask. However, those skilled in the art will understand that in a dual-mask process both masks could be phase-shift masks, although not necessarily with the same phase-shift. Either the phase-shift mask or trim mask may be used first. This process characteristic may optimize throughput by reducing the time necessary for exposure setup. For example, a first exposure is made with the phase-shift mask followed by exposure with the trim mask. The process is then repeated on a new workpiece wherein the first exposure is made with the trim mask and the second exposure is made with the phase-shifting mask, thereby eliminating the need to replace the mask or change the setup between at least two exposures. The dual-mask process greatly improves resolution and process latitude in gate level lithography.

Embodiments of the invention provide the first known successful application of strong phase-shift lithography to random logic circuits. To implement a multi-mask or dual-mask process, conventional gate layouts must first be converted to phase-shift mask patterns. This is difficult to achieve with random patterns compared to repetitive patterns. Software, such as Numerical Technologies' PSMSHRINKIT, may be utilized to perform this procedure. PSMSHRINKIT, is capable of defining phase shift and trim patterns for integrated circuit layouts. A PSMSHRINKIT formed phase-shift mask consists of pairs of adjacent clear rectangles separated by a small dark line. The rectangles are assigned phases such that the small line between them has zero degree phase and 180 degree phase shifted light on each side.

PSMSHRINKIT begins the process with what is called the "compile" step. It searches through the design file and identifies all gate POLY features by comparing the overlap of POLY with a diffusion or TOX mask layer. The endcap and runner sides of the gates are identified so that the two ends of the gate can be modified independently, if necessary. The program then identifies gates for phase shifting that have lengths in a particular range (for instance, all gates with lengths from 0 to 500 nm can be selected). The software creates two rectangular or polygonal blocks on each side of the gates, with a defined gap between them. These objects become the phase-shift mask pattern.

PSMSHRINKIT also creates a binary trim mask pattern wherein runners are essentially unchanged, but the gates over a field oxide are enlarged so that the phase shift exposures are protected.

Those skilled in the art will understand that software may be utilized that converts gate layouts to phase-shift mask patterns by processes other than PSMSHRINKIT, for example, processes utilizing other phase differences, gate length ranges or object shapes, and are therefore, within the spirit and scope of the invention.

Following is an example of the use of the dual mask process to pattern a component on or within a device layer or layers such as, for example, a gate electrode. The phase-shift mask may comprise pairs of adjacent clear rectangles separated by small dark lines. The rectangles are assigned phases such that the small lines between them have phase-shifted light on either side differing by approximately 180°. The overall tone of the mask is dark-field so that after exposure with the mask on a workpiece, only the rectangles are imaged. A second exposure is performed through a bright-field mask. This exposure images components over the field oxide and acts as a shadow to prevent a second exposure in the gate area. Additional software, such as Numerical Technologies' NANOSURFER, may be used to determine the amount of the phase-shift and trim features needed to adequately form phase-shifted gates with desired lengths and widths.

In one embodiment of the invention the phase-shift mask is a dark field mask and the non-phase-shift mask is a bright field mask. Any type of phase-shift mask may used with any combination of phases suitable for improving resolution over a binary mask. Conventional phase-shift masks such as strong phase-shifting alternating aperture masks with two phases differing by 180° are readily available and generally sufficient to provide the resolution desired to achieve gate lengths of less than about 0.12 μm when used according to embodiments of the invention. Any radiation source may be used that is compatible with the radiation-sensitive material used. This may include for example 157 nm, 193 nm and 248 nm wavelength radiation sources. A 248 nm wavelength radiation source is likely to be desirable because of its wide spread availability.

Although the invention has thus far been described with respect to random logic circuits, embodiments are applicable to repetitive and random patterns, and combinations thereof.

A $n^+/p^+$ dual-Poly:Si module may be used which further improves device performance by depressing sub-threshold transistor currents. To improve performance and reliability further, dopant penetration suppression techniques may be utilized when applicable. Such suppression techniques may include, but are not limited to, providing a nitrogen doped WSi layer to prevent dopant lateral diffusion and/or providing a nitrogen implanted silicon oxide layer.

FIGS. 1A–1D depict fabrication of semiconductor device 100 according to embodiments of the invention. FIG. 1A shows substrate 102, for example silicon or gallium arsenide with a dielectric layer 104 provided thereon. Examples of dielectric materials include, but are not limited to, $SiO_2$, $SiO_2/Si_3N_4$ stack, $Ta_2O_5$ and $SiO_2$ with incorporated nitrogen. Dielectric layer 104 may be formed by any conventional growth or deposition method. Illustrative examples include, $SiO_2$ growth followed by $Si_3N_4$ deposition, $N_2$ introduction during $SiO_2$ growth, and $N_2$ implantation of the substrate followed by $SiO_2$ growth. A component layer 106, comprising for example polysilicon, amorphous silicon, titanium nitride disposed on polysilicon, tungsten, tungsten silicide disposed on polysilicon, tantalum, tantalum disposed on polysilicide, among others, is disposed on dielectric layer 104. Additional examples of component layer materials include aluminum, tungsten or a stack of Ti, TiN, Al, TiN. Component layer 106 may be provided on the dielectric layer 104 by any conventional method and may include chemical vapor deposition, physical vapor deposition or a combination thereof. Component layer 106 may be that which is used to form a gate electrode for example or other device components.

One or more dopants may be introduced into at least a portion of component layer 106 to form an $n^+$ layer and a $p^+$ layer. Examples of $n^+$ dopants include, but are not limited to, arsenic, phosphorus and a combination thereof. $p^+$ dopants may comprise boron, $BF_2$ and a combination thereof. In one embodiment of the invention the $p^+$ dopant is boron and the $n^+$ dopant is phosphorus.

A hard mask 108 is provided on component layer 106 and may comprise, for example, silicon dioxide, silicon nitride, silicon oxynitride, and spin on glass. Hard mask 108 may be disposed by any conventional method, for example, chemical vapor deposition and plasma enhanced chemical vapor deposition.

Figure 1B:
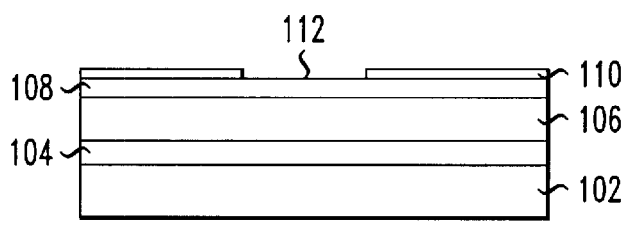

A radiation-sensitive material 110, for example, photoresist, is disposed on hard mask 108. The type of radiation-sensitive material used will depend in part on the type of device being fabricated, the radiation source and the materials used in the device. An anti-reflective layer (not shown) may also be utilized to enhance resolution. Radiation-sensitive material 110 is exposed utilizing a multiple-mask process such as the dual-mask process described above. Typically, the multiple-mask process will comprise exposing radiation-sensitive material 110 through a phase-shift mask to define a first portion of a component, and exposing radiation-sensitive material 110 through a binary mask to shadow the first portion of the component and define a second portion of the component. Either the phase-shifting exposure or the binary exposure may be performed first. FIG. 1B depicts pattern portion 112 within radiation-sensitive material 110.

In one embodiment of the invention the first component portion is an active region and the second component portion is a field oxide region. The first and second component portions may be exposed with a dose in the range of about 20 mJ/$cm^2$ to about 40 mJ/$cm^2$. The dose may be the same for both component portions or may vary.

For a gate electrode, for example, substantially all active device features are phase-shifted. Most of all other features, such as runners and isolation areas are not phase-shifted.

Processes utilizing multiple applications of radiation-sensitive material may also be implemented. Such processes may decrease throughput but may provide broader applications of the invention.

Figure 1C:
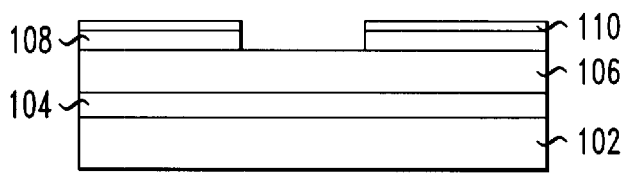
Figure 1D:
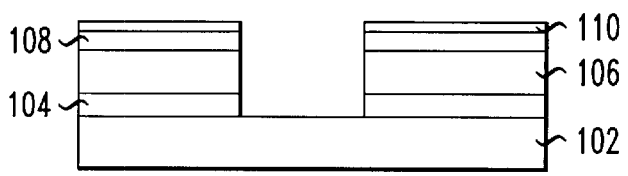

FIG. 1C depicts hard mask 110 etched to component layer 106 as patterned by radiation-sensitive material 110. Hard mask 110 may be etched, for example by reactive ion etching or anisotropic plasma etching. Examples of etchants include, but are not limited to a $CHF_3/CF_4$ mixture, $CHF_3/CF_4/Ar$ mixture, and $CHF_3/CF_4/O_2$ mixture. As depicted in FIG. 1D radiation-sensitive material 110 may then be removed and component layer 106 and dielectric layer 104 etched as patterned by hard mask 108. Illustrative examples of component and dielectric layer etching methods include reactive ion etching and anisotropic plasma etching. Component layer etchants include for example, a Cl/HBr mixture, Cl/HBr/He mixture, Cl/HBr/$O_2$ mixture, $CF_4$, $SF_6$, and a chlorine mixture with or without $N_2$. Dielectric layer 104 may be etched by methods such as are used to etch hard mask layer 108.

Component layer 106 may be formed by providing a barrier layer on a semiconductor layer. The barrier layer reduces dopant penetration from the component layer to the dielectric layer. The barrier layer may comprise for example WSiN, TaN, WN or a combination thereof. A metal-containing layer may then be formed on the barrier layer and may comprise, for example WSi, TaSi and W. The metal-containing layer reduces gate access resistance. Generally a barrier layer is desirable if the component layer includes polysilicon. If the component layer is a metal or metal silicide the barrier layer types described above are typically not necessary.

Embodiments of the invention provide, for example, a digital signal processor wherein components may have a critical dimension of less than about 0.12 $\mu$m. A digital signal processor may be fabricated having a frequency in the range of about 100 MHz to 250 MHz and a supply-voltage in the range of about 0.5V to 1.0V. In one embodiment of the invention the digital signal processor has a frequency of greater than about 50 MHz, and in another embodiment the processor has a supply-voltage of less than about 0.75V.

Figure 2A:
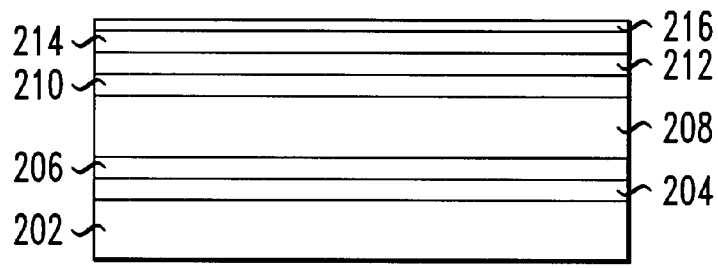
FIGS. 2A–2E depict fabrication of a gate electrode according to embodiments so of the invention.
Figure 2B:
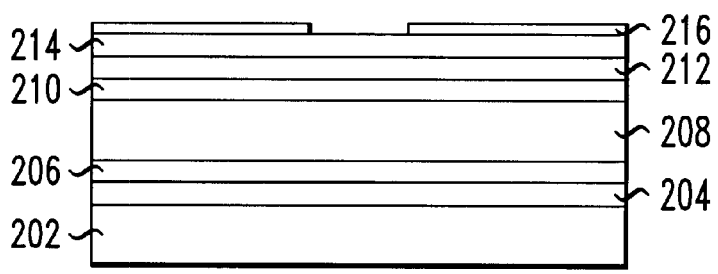
Figure 2C:
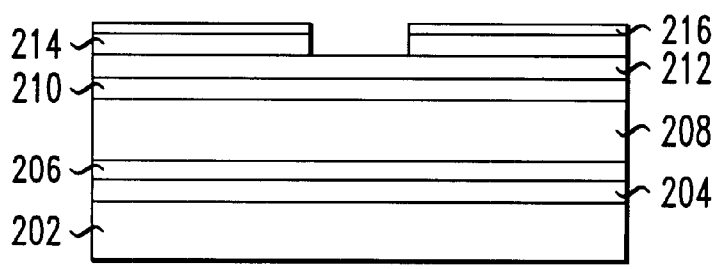
Figure 2D:
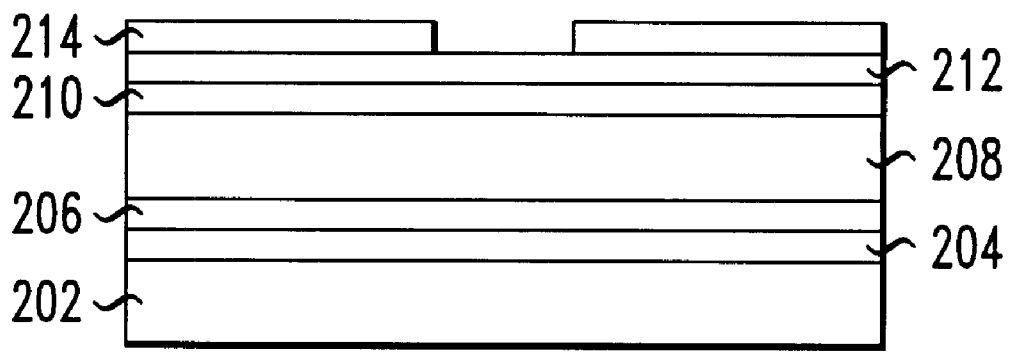
Figure 2E:
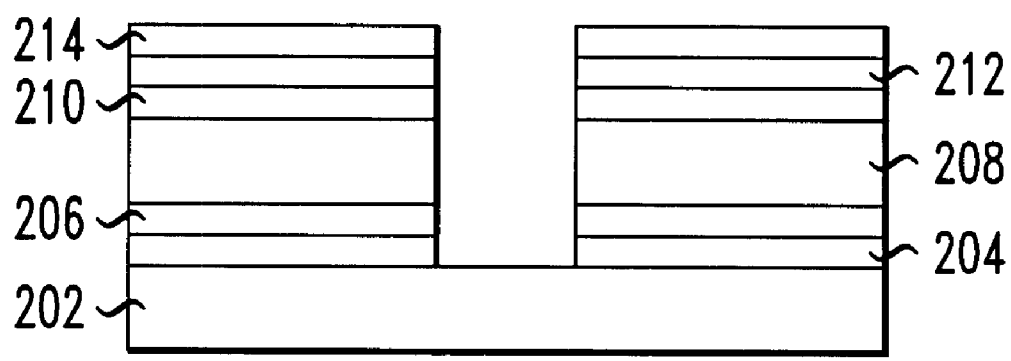

FIGS. 2A–2E depict an example of an embodiment of the invention by which a gate electrode may be fabricated that is useful in the manufacture of a digital signal processor. As shown in FIG. 2A, silicon substrate 202 is provided on which a $SiO_2$ layer 204 is disposed. A $Si_3N_4$ layer 206 is formed on $SiO_2$ layer 204 to inhibit dopant penetration to $SiO_2$ layer 204. A polysilicon layer 208 is formed on $Si_3N_4$ layer 206 and constitutes the component layer. Phosphorus is then implanted into polysilicon layer 208 to form an n$^+$ region and boron is implanting in polysilicon layer 208 to form a p$^+$ region. A WSiN layer 210 is then formed on polysilicon layer 208 as a barrier that suppresses boron penetration. A WSi layer 212 may then be provided on WSiN layer 210 to reduce gate resistance. A silicon dioxide layer 214 is then formed on top of WSi layer 212 to form a hard mask. Silicon dioxide layer 214 is patterned by forming a photoresist layer 216 thereon and exposing photoresist layer 216, for example with a 248 nm wavelength light source. As shown in FIG. 2B photoresist layer 216 is patterned, such as by a dual-mask process. The dual-mask process may comprise, exposing photoresist layer 216 through a dark field phase-shift mask to define a first portion of the gate electrode, and exposing photoresist layer 216 through a bright field binary mask to shadow the first portion of the gate electrode and define a second portion of the gate electrode. Exposures may be performed with a 248 nm wavelength light source. Either the phase-shifting exposure or the binary exposure may be performed first. As shown in FIG. 2C silicon dioxide layer 214 is etched to WSi layer 212. Photoresist layer 216 is then removed as shown in FIG. 2D. Silicon dioxide layer 214 provides a mask for etching WSi layer 212 and WSiN layer 210, for example, with an anisotropic plasma etch. Polysilicon layer 208 may also be etched by an anisotropic plasma etch as patterned by silicon dioxide mask 214. $Si_3N_4$ layer 206 and $SiO_2$ layer 204 may be etched by any conventional method compatible with the device fabrication. The resulting structure is depicted in FIG. 2E.

While the invention has been described in what is presently considered to be preferred embodiments, many variations and modifications will become apparent to those skilled in the art. For example, the multi-mask processes, dopant penetration suppression techniques and device materials may be modified or varied within the spirit and scope of the invention. Accordingly, it is intended that the invention not be limited to the specific illustrative embodiments but be interpreted within the full spirit and scope of the appended claims.

What is claimed is:

1. A method of fabricating a semiconductor device component comprising:

providing a substrate;

providing a dielectric layer on the substrate;

providing a component layer on the dielectric layer;

providing a hard mask layer on top of the component layer;

providing radiation-sensitive material on the hard mask layer;

exposing the radiation-sensitive material to pattern the hard mask layer wherein exposures are made utilizing a multiple-mask exposure process;

etching the hard mask layer to the component layer;

removing the radiation-sensitive material;

etching the component layer as patterned by the hard mask.

2. The method of claim 1 wherein the multiple-mask process comprises:

exposing the radiation-sensitive material through a phase-shift mask to define a first portion of the component; and exposing the radiation-sensitive material through a non-phase-shift mask to shadow the first portion of the component and define a second portion of the component, wherein either the phase-shifting exposure or the non-phase-shifting exposure may be performed first.

3. The method of claim 2 wherein the first component portion is an active region and the second component portion is a field oxide region.

4. The method of claim 2 further comprising exposing the first component portion with an exposure dose in the range of about 20 mJ/cm$^2$ to about 40 mJ/cm$^2$.

5. The method of claim 2 further comprising exposing the second component portion with an exposure dose in the range of about 20 mJ/cm$^2$ to about 40 mJ/cm$^2$.

6. The method of claim 2 wherein the phase-shift mask is a dark field mask.

7. The method of claim 2 wherein the a non-phase-shift mask is a bright field binary mask.

8. The method of claim 2 wherein the phase-shift mask is selected from the group consisting of strong phase-shift mask and alternating aperture mask.

9. The method of claim 1 wherein the radiation-sensitive material is exposed with a 248 nm wavelength radiation source.

10. The method of claim 1 wherein the substrate is silicon or gallium arsenide.

11. The method of claim 1 wherein the dielectric layer is selected from the group consisting of $SiO_2$, $SiO_2/Si_3N_4$ stack, $Ta_2O_5$, $SiO_2$ with incorporated nitrogen.

12. The method of claim 11 wherein the dielectric layer is formed by a method selected from $SiO_2$ growth followed by Si$_3$N$_4$ deposition, N$_2$ introduction during SiO$_2$ growth, and N$_2$ implantation of substrate followed by SiO$_2$ growth.

13. The method of claim 1 wherein the component layer is selected from the group consisting of polysilicon, amorphous silicon, titanium nitride disposed on polysilicon, tungsten, tungsten silicide disposed on polysilicon, tantalum and tantalum disposed on polysilicide.

14. The method of claim 1 wherein the component layer is selected from the group consisting of aluminum, tungsten or a stack of Ti, TiN, Al, TiN.

15. The method of claim 1 wherein one or more dopants are introduced into at least a portion of the component layer to form an n$^+$ layer.

16. The method of claim 15 wherein the dopant is selected from the group consisting of arsenic, phosphorus and a combination thereof.

17. The method of claim 1 wherein one or more dopants are introduced into at least a portion of the component layer to form a p$^+$ layer.

18. The method of claim 17 wherein the p$^+$ dopant is selected from the group consisting of boron, BF$_2$ and a combination thereof.

19. The method of claim 1 wherein a p$^+$ dopant comprising boron and an n$^+$ dopant comprising phosphorus are introduced into the component layer.

20. The method of claim 1 wherein the hard mask layer is selected from the group consisting of silicon dioxide, silicon nitride, silicon oxynitride, and spin on glass.

21. The method of claim 1 wherein the hard mask layer is provided on the component layer by a method selected from the group consisting of chemical vapor deposition and plasma enhanced chemical vapor deposition.

22. The method of claim 1 wherein the hard mask is etched by a method selected from the group consisting of reactive ion etching and anisotropic plasma etching.

23. The method of claim 1 wherein the hard mask is etched with an etchant selected from the group consisting of CHF$_3$/CF$_4$ mixture, CHF$_3$/CF$_4$/Ar mixture, and CHF$_3$/CF$_4$/O$_2$ mixture.

24. The method of claim 1 wherein the component layer is etched by a method selected from the group consisting of reactive ion etching and anisotropic plasma etching.

25. The method of claim 1 wherein the component layer is etched with an etchant selected from the group consisting of Cl/HBr mixture, Cl/HBr/He mixture, Cl/HBr/O$_2$ mixture, CF$_4$, SF$_6$, and a chlorine mixture with or without N$_2$.

26. The method of claim 1 wherein the component layer is provided on the dielectric layer by a method selected from the group consisting of chemical vapor deposition, physical vapor deposition and a combination thereof.

27. The method of claim 1 wherein the radiation-sensitive material is a photoresist.

28. The method of claim 1 wherein the device component is a gate electrode.

29. The method of claim 28 wherein the component layer is formed by:
   providing a semiconductor layer;
   providing a barrier layer on the semiconductor layer;
   providing a metal-containing layer on the barrier layer.

30. The method of claim 29 wherein the barrier layer is selected from a group consisting of WSiN, TaN and WN.

31. The method of claim 29 wherein the metal-containing layer is selected from a group consisting of WSi, TaSi and W.

32. The method of claim 1 wherein the device component is a gate electrode.

33. The method of claim 1 wherein the hard mask is patterned, at least in part, with an image representing random logic circuitry.

34. The method of claim 1 wherein the multi-mask exposure process provides a critical component dimension of less than about 0.12 µm.

35. The method of claim 1 wherein the multi-mask exposure process provides a frequency of greater than about 50 MHz for a digital signal processor.

36. A method of fabricating a gate electrode useful in the manufacture of a digital signal processor, the method comprising:
   providing a silicon substrate;
   providing a SiO$_2$ layer on the substrate;
   providing a Si$_3$N$_4$ layer on the SiO$_2$ layer;
   providing a polysilicon layer on the Si$_3$N$_4$ layer;
   implanting phosphorus in the polysilicon layer to form an n$^+$ region;
   implanting boron in the polysilicon layer to form a p$^+$ region;
   depositing WSiN on the polysilicon layer;
   depositing WSi on the WSiN layer;
   providing a SiO$_2$ layer on top of the WSi layer;
   providing a photoresist layer on the SiO$_2$ layer;
   exposing the photoresist, with a 248 nm wavelength light source, through a dark field phase-shift mask to define a first portion of the gate electrode;
   exposing the photoresist, with a 248 nm laser, through a bright field binary mask to shadow the first portion of the gate electrode and define a second portion of the gate electrode, wherein either the phase-shifting exposure or the binary exposure may be performed first;
   etching the SiO$_2$ layer to the WSi;
   removing the photo resist;
   etching the WSi and WSiN with anisotropic plasma etch; and
   etching the polysilicon with an anisotropic plasma etch.

37. A method of fabricating a gate electrode useful in the manufacture of a digital signal processor, the method comprising:
   providing a substrate;
   providing a gate oxide layer on the substrate;
   providing a dielectric layer on the gate oxide layer;
   providing a gate electrode layer on the dielectric layer;
   forming an n$^+$ region in the gate electrode layer;
   forming a p$^+$ region in the gate electrode layer;
   providing a barrier layer on the gate electrode layer;
   providing a hard mask layer on the barrier layer;
   providing a photoresist layer on the hard mask layer;
   exposing the photoresist through a phase-shift mask to define a first portion of the gate electrode;
   exposing the photoresist through a non-phase-shift mask to shadow the first portion of the gate electrode and define a second portion of the gate electrode, wherein either the phase-shifting exposure or the non-phase-shift exposure may be performed first;
   etching the hard mask layer to the barrier layer;
   removing the photo resist; and
   etching the gate electrode and barrier layers.

* * * * *